United States Patent [19]

Fukuda

[11] Patent Number: 5,761,143
[45] Date of Patent: Jun. 2, 1998

[54] USING AN OUTPUT OF A LEAK DETECTOR WHICH DETECTS LEAKAGE FROM A DUMMY MEMORY CELL TO CONTROL A SUBTRATE VOLTAGE IN A SEMI CONDUCTOR MEMORY DEVICE

[75] Inventor: Tatsuya Fukuda, Tokyo, Japan

[73] Assignee: Mitsubishi Denki Kabushiki Kaisha, Tokyo, Japan

[21] Appl. No.: 862,642

[22] Filed: May 23, 1997

[30] Foreign Application Priority Data

Dec. 19, 1996 [JP] Japan ................. 8-339344

[51] Int. Cl.⁶ ................................ G11C 7/02
[52] U.S. Cl. ............... 365/210; 365/189.07; 365/189.09
[58] Field of Search ................ 365/210, 189.07, 365/189.09

[56] References Cited

U.S. PATENT DOCUMENTS 4,307,307  12/1981  Parekh ..................... 327/537
5,592,423  1/1997   Tokami .................... 365/221
5,680,357  10/1997  Sung et al. ............... 365/210

FOREIGN PATENT DOCUMENTS 5-205465  8/1993  Japan.
5-225777  9/1993  Japan.

Primary Examiner—David C. Nelms
Assistant Examiner—Hoai V. Ho
Attorney, Agent, or Firm—McDermott, Will & Emery

[57] ABSTRACT

In a semiconductor memory device, a dummy memory cell is formed on a semiconductor substrate in the same way as the memory cell is formed. A leak detecting means for detecting leakage from the dummy memory cell generates an output signal representing the amount of the leakage. A substrate-voltage generating means controls substrate voltage applied to the semiconductor substrate so as to reduce the amount of leakage from the memory cell in accordance with the output signal supplied to the substrate-voltage generating means by the leak detecting means.

8 Claims, 4 Drawing Sheets

5,761,143

1

USING AN OUTPUT OF A LEAK DETECTOR WHICH DETECTS LEAKAGE FROM A DUMMY MEMORY CELL TO CONTROL A SUBTRATE VOLTAGE IN A SEMI CONDUCTOR MEMORY DEVICE

TECHNICAL FIELD

The present invention is related to a semiconductor memory device. In particular, the present invention is related to a dynamic random-access memory device which requires memory refresh operations.

BACKGROUND ART

In a dynamic random-access memory device (DRAM), as one kind of semiconductor memory device, signal electric charge stored in one of the electrodes of a MOS transistor used as a memory cell leaks with the lapse of time. It is thus necessary to regenerate the signal electric charge, that is, to carry out a refresh operation. During a refresh operation, an operation to write or read a signal can not be performed. It is therefore desirable to have a long interval between two consecutive required refresh operations. That is to say, it is desirable to have a small amount of leakage of the stored signal electric charge.

In the conventional DRAM and other semiconductor memory devices that require refresh operations, the holding time of the signal electric charge varies from device to device due to, among other causes, variations in device manufacturing process parameters. In some cases, the signal electric charge probably can not be preserved as long as a prescribed holding time for a device, so that the refresh operation carried out for the device is not effective. Such a device is inevitably regarded as being ineffective. In such a case, the entire lot is much likely regarded as being ineffective, which leads to a low yield.

FIG. 11 is a diagram showing a cross section of a configuration of a MOS transistor composing a memory cell of a DRAM. Also shown in the figure are destinations to which electric charge leaks from the memory cell.

As shown in FIG. 11, in a p-type semiconductor substrate 1, n+ type regions 2 to 5 are formed as a source or drain. An element separation insulation film (an oxide film) 6 of a LOCOS type for example is formed on the p-type semiconductor substrate 1. A gate insulating film (an oxide film) 7 is formed on the surface of the p-type semiconductor substrate 1. Each gate electrode 8 to 10 is formed on the gate insulating film 7, and serves as a word line. Each storage node 11 and 12 is formed as one of the electrodes of a capacitor for accumulating electric charge. Further, an interlayer oxide film 13 is formed on the whole surface of the semiconductor substrate 1. In the example shown in FIG. 1, the memory cell is formed on the semiconductor substrate 1. It should be noted, however, that a memory cell can also be formed on a well region in the semiconductor substrate. For the purpose of explanation which follows, the memory cell formed on the memory substrate 1 as shown in FIG. 11 is representative. It is also to be noted that structural portions of the memory cell other than those shown in FIG. 11 are not directly related to the following description, and are omitted from FIG. 11 for simplicity.

In a memory cell with such a structure, information is stored as electric charge in the storage nodes 11 and 12 which are connected to the n+ regions 3 and 4 respectively. However, the electric charge leaks with the lapse of time. To begin with, consideration is given to the leakage of the electric charge stored in the n+ region 3. In the first place,

2 the electric charge leaks from the n+ region 3 in a direction indicated by arrow ① with respect to the p-type substrate 1 to which a substrate voltage VBB is applied. In addition, leakage in a direction indicated by arrow ② is also conceived. In this case, electric charge leaks from the n+ region 3 to the n+ region 2 through a substrate portion beneath the gate electrode 8. Further, leakage in a direction indicated by arrow ③ is also conceived. In this case, electric charge leaks from the n+ region 3 to the adjacent n+ region 4 through a substrate portion beneath the element isolation region 6 formed by a Locos oxide film. In this way, the accumulated electric charge is lost due to leakage in three types of leak modes. Therefore, the interval between two consecutive refresh operations needs to be shortened in order to prevent the effectiveness of the refresh operations from degrading.

DISCLOSURE OF THE INVENTION

In order to solve the problem encountered in the conventional semiconductor memory device described above, the present invention provides a semiconductor memory device wherein the level of a substrate voltage VBB is controlled for preserving the effectiveness of refresh operations. In the semiconductor memory device, the amount of leakage from the memory cell is decreased by controlling the level of the substrate voltage VBB, and a high yield is achieved in manufacturing.

According to one aspect of the present invention, a semiconductor memory device comprises a memory cell formed on a semiconductor substrate. A dummy memory cell is formed on the semiconductor substrate in the same way as the memory cell is formed. A leak detecting means included in the semiconductor device detects leakage from the dummy memory cell and generates an output signal representing the amount of the leakage. A substrate-voltage generating means included in the semiconductor device controls a substrate voltage applied to the semiconductor substrate so as to reduce the amount of leakage from the memory cell in accordance with the output signal supplied to the substrate-voltage generating means by the leak detecting means.

In another aspect of the present invention, in the semiconductor memory device, the substrate voltage is controlled to a shallow level by the output signal generated by the leak detecting means.

In another aspect of the present invention, in the semiconductor memory device, the dummy memory cell comprises a MOS transistor formed on a substrate portion for the dummy memory cell, and leakage between a drain of the MOS transistor and the substrate portion is detected.

In another aspect of the present invention, in the semiconductor memory device, the substrate voltage is controlled to a deeper level by the output signal generated by the leak detecting means.

In another aspect of the present invention, in the semiconductor memory device, the dummy memory cell comprises a MOS transistor formed on a substrate portion for the dummy memory cell, and leakage between a drain and a source of the MOS transistor is detected.

In another aspect of the present invention, in the semiconductor memory device, a gate insulating film of the dummy memory cell is formed as an element separating insulation film of the memory cell is formed.

According to another aspect of the present invention, a semiconductor memory device comprises memory cells formed on a semiconductor substrate. At least two dummy memory cells are formed on the semiconductor substrate in the same way as the memory cells are formed. At least two leak detecting means associated with the dummy memory cells each detects leakage from the respective dummy memory cell and generates an output signal representing the amount of the leakage. A comparison means compares the output signals generated by the leak detecting means with each other and generates a comparison output signal. Further, a substrate-voltage generating means controls a substrate voltage applied to the semiconductor substrate so as to reduce the amount of leakage from the memory cells in accordance with the comparison output signal supplied to the substrate-voltage generating means by the comparison means.

In another aspect of the present invention, in the semiconductor memory device, the dummy memory cells each comprise a MOS transistor formed on a substrate portion for the dummy memory cell, and leakage between a drain of the MOS transistor and the substrate portion is detected by one of the leak detecting means while leakage between the drain and a source of the MOS transistor is detected by the other leak detecting means.

Other features and advantages of the present invention will become more apparent from the following description taken together with the accompanying drawings.

BEST MODE FOR CARRYING OUT THE INVENTION

The present invention will become more apparent from the following detailed description of some preferred embodiments with reference to accompanying diagrams showing the embodiments.

First Embodiment

Figure 1:
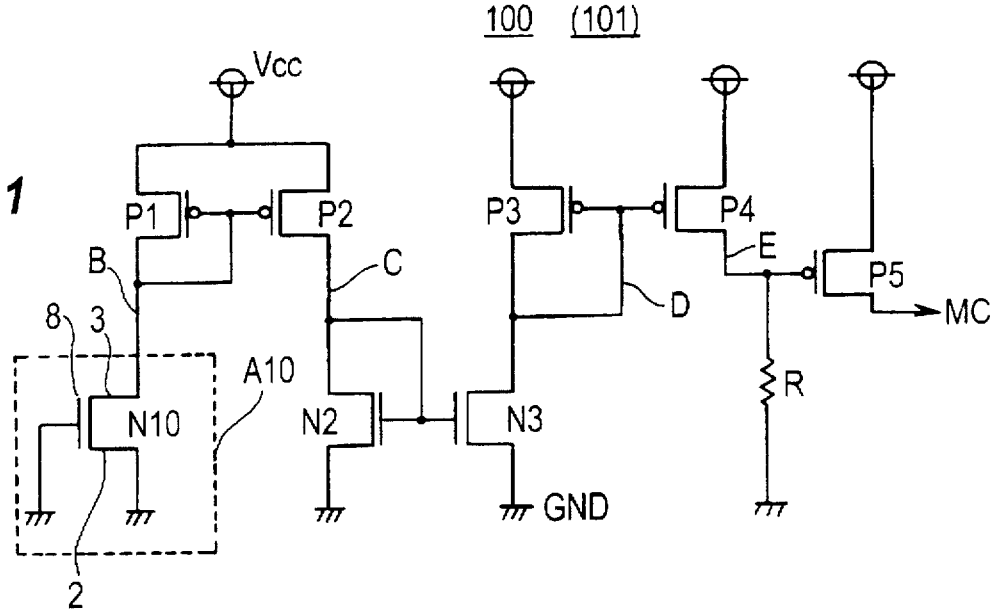
FIG. 1 is a circuit diagram showing a configuration of a leak detecting means or a memory-cell leak monitor for detecting leakage of electric charge from a memory cell in a semiconductor memory device according to a first embodiment of the present invention.
Figure 2:
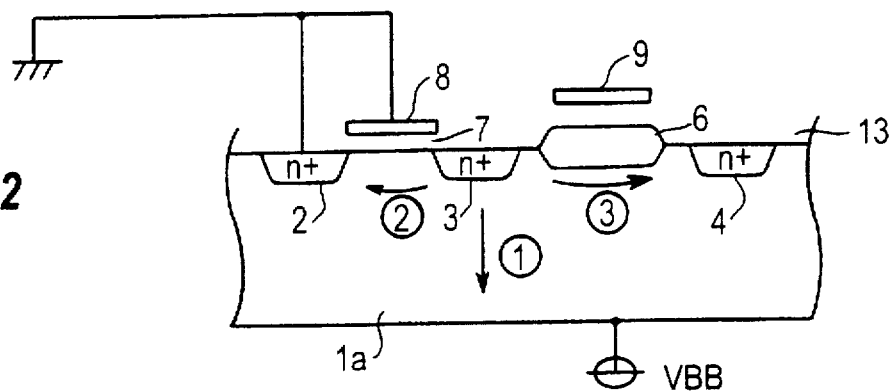
FIG. 2 is a cross-sectional diagram showing connection of a dummy memory cell in the circuit shown in FIG. 1.
Figure 3:
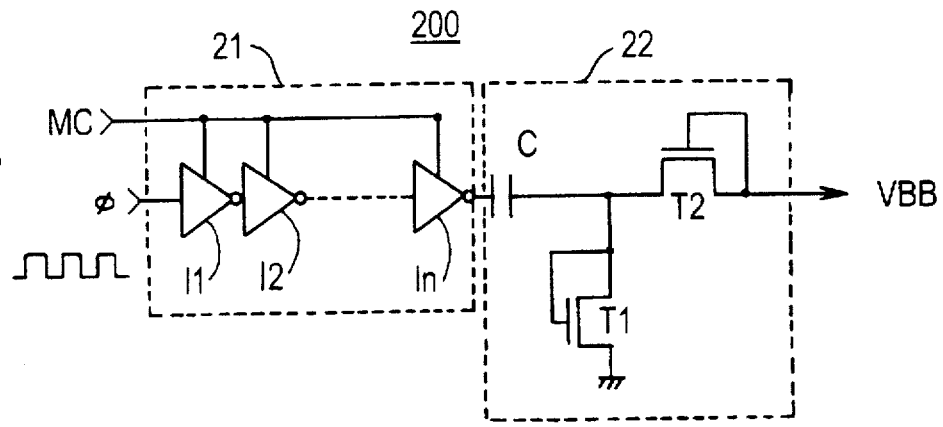
FIG. 3 is a circuit diagram showing the configuration of a substrate-voltage generating circuit for generating a substrate voltage in accordance with an output signal supplied thereto by the memory-cell leak monitor shown in FIG. 1.

FIG. 1 is a circuit diagram showing a configuration of a leak detecting means or a memory-cell leak monitor for detecting leakage of electric charge from a memory cell in a semiconductor memory device according to a first embodiment of the present invention. FIG. 2 is a cross-sectional diagram showing connection of a dummy memory cell in the circuit shown in FIG. 1. FIG. 3 is a circuit diagram showing the configuration of a substrate-voltage generating circuit for generating a substrate voltage in accordance with an output signal supplied thereto by the memory-cell leak monitor shown in FIG. 1. The semiconductor memory device provided by the first embodiment of the present invention, wherein these circuits are formed on a semiconductor substrate along with memory cells, reduces the amount of leakage of electric charge from each of the memory cells by controlling the electric potential of the semiconductor substrate.

First of all, the configuration of the memory-cell leak monitor 100 shown in FIG. 1 is explained. As shown in FIG. 1, a dummy memory cell A10 for memory-cell leak monitoring includes a MOS transistor N10. The dummy memory cell A10 is designed into the same configuration as the memory cell. The memory-cell leak monitor 100 further includes n-type MOS transistors N2 and N3, and p-type MOS transistors P1 to P5. A load resistor R is connected to the output transistor P5, and an output signal MC is generated from the source electrode of the output transistor P5. A power-supply voltage VCC of typical value of 3.3 V is supplied between the ground potential of the ground terminal GND. As shown in FIG. 2, a substrate voltage VBB of normally −2 V is applied to the semiconductor substrate 1a. In such a circuit configuration, the level of the output signal MC varies to represent the detected amount of leakage of electric charge from the dummy memory cell A10. It should be noted that, since the amount of leakage of electric charge from the MOS transistor N10 of the dummy memory cell A10 is small, several thousands of such MOS transistors are connected in parallel in order to raise the detection accuracy. For the sake of simplicity, however, only one MOS transistor is shown in FIG. 1.

Next, FIG. 2 shows a cross-sectional structure and a connection of the MOS transistor N10 of the dummy memory cell A10 shown in FIG. 1. The MOS transistor N10 is formed in the same way as a memory cell to simulate the memory cell.

As shown in FIG. 2, the dummy cell A10 is formed on a substrate 1a, precisely, a p-type semiconductor substrate 1a. The dummy cell A10 is comprised of n+ regions 2 to 4 which is used as a source or drain. An element isolation film 6 of a LOCOS type oxide film is formed on the semiconductor substrate 1a. A gate insulating film 7 of an oxide film is formed on the surface of the semiconductor substrate 1a. Gate electrodes 8 and 9 are formed on the gate insulating film 7, and serve as word lines respectively. An interlayer oxide film 13 is formed to cover the whole surface of the semiconductor substrate 1a. Although the dummy memory cell A10 is formed on the semiconductor substrate 1a in the example shown in FIGS. 1 to 3, it should be noted that the dummy memory cell can also be formed on a well region in the semiconductor substrate 1a. In the explanation hereinafter, the dummy memory cell formed on the memory substrate 1a is representative of those variations. It is also to be noted that structural portions of the memory cell other than that shown in FIG. 2 are not directly related to the following description. Therefore, those portions are omitted from FIG. 2 for simplicity.

As shown in FIG. 2, in the MOS transistor N10 of the dummy memory cell A10, the n+ source region 2 and the gate 8 are connected to ground, while the substrate voltage VBB is applied to the p-type semiconductor substrate 1a of the dummy memory cell A10. In such a state, electric charge may leak from the drain 3 in directions indicated by arrows ①, ② and ③.

Next, the operation of the memory-cell leak monitor 100 shown in FIG. 1 is explained. In FIG. 1, the gate 8 of the n-channel MOS transistor N10 of the dummy memory cell A10 is connected to the ground GND, so that the transistor N10 will not be turned on. If it is assumed that, at that time, there is no leakage of electric charge from the drain 3 used as an electric-charge storing electrode, no current will flow in the n-channel MOS transistor N10 of the dummy memory cell A10. As a result, a node B is stabilized at a threshold voltage VtP1 of the p-channel MOS transistor P1.

If the threshold voltage of the p-channel MOS transistor P2 is set at the same value as that of the p-channel MOS transistor P1, the p-channel MOS transistor P2 will also be in an off state. Thus, power voltage will not be supplied to a node C. As a result, the n-channel MOS transistors N2 and N3 are also turned off. Since the n-channel MOS transistor N3 is in an off state, a node D is stabilized at a threshold voltage VtP3 of the p-channel MOS transistor P3. If the threshold voltage of the p-channel MOS transistor P4 is set at the same value as that of the p-channel MOS transistor P3, the p-channel MOS transistor P4 is also in an off state, setting a node E at the electric potential of the ground GND. As a result, the p-channel MOS transistor P5 is turned on, outputting the signal MC at a fixed electric potential.

If there is leakage in the dummy memory cell A10 shown in FIG. 1, a similar current also flows into the n-channel MOS transistor N2, since the circuit shown in FIG. 1 forms a current mirror structure. In addition, since a current also flows into the n-channel MOS transistor N3, the level of the node D drops, causing the p-channel MOS transistor P4 to enter into an on state, in which the level of the node E rises. Accordingly, the p-channel MOS transistor P5 transits from a strong on state to a weak on state. As a result, the level of the output signal MC drops to a certain degree. In this way, an output signal MC which is dependent upon the amount of leakage occurring in the dummy memory cell A10 is obtained.

FIG. 3 is a diagram showing the configuration of the substrate-voltage generating circuit 200. As shown in FIG. 3, a ring oscillator 21 comprises inverters I1, I2 ... and In, and a smoothing unit 22 comprises a capacitor C and transistors T1 and T2. A pulse input signal φ is supplied to the ring oscillator 21. The output signal MC generated by the memory-cell leak monitor 100 shown in FIG. 2 is supplied to the ring oscillator 21 as a power-supply voltage thereof. An output voltage VBB generated by the smoothing unit 22 is applied as a substrate voltage to the semiconductor substrate of the memory cells.

In the memory-cell leak monitor 100 shown in FIG. 1, if it is assumed that there is no leakage of electric charge from the drain 3 of the n-channel MOS transistor N10 of the dummy memory cell A10, no current flows in the n-channel MOS transistor N10. Accordingly, the level of the output signal MC is fixed as described above. Since the output signal MC is used as a power-supply voltage of the ring oscillator 21 of the substrate-voltage generating circuit 200, the fixed level of the output signal MC sets the substrate electric potential VBB output by the substrate-voltage generating circuit 200 at a fixed level as well.

In the memory-cell leak monitor 100 shown in FIG. 1, if there is leakage of electric charge from the drain 3 of the n-channel MOS transistor N10 of the dummy memory cell A10, a current flows in the n-channel MOS transistor N10, causing the level of the output signal MC to drop as described earlier. When the level of the output signal MC drops, the period of the ring oscillator 21 employed in the substrate-voltage generating circuit 200 shown in FIG. 3 is lengthened, making the level of the substrate voltage output by the smoothing unit 22 shallow. That is to say, the negative electric potential of the substrate voltage is shifted to the positive side to a certain degree. In this way, by using the means and method described above, the substrate voltage VBB can be controlled in accordance with the characteristics of the memory cell.

In general, in a memory cell, when the level of the substrate electric potential VBB is deeper, that is, the level of the substrate electric potential VBB is pulled down in the negative direction, then the amount of leakage is larger. As a result, the interval between two consecutive required refresh operations is shorter. That is to say, the refresh requirement becomes more severe. On the other hand, when the level of the substrate electric potential VBB is shallower, that is, the level of the substrate electric potential VBB is pulled up in the positive direction, then the amount of leakage is smaller. As a result, the interval between two consecutive required refresh operations is longer. That is to say, the refresh requirement becomes less severe. As a result, by making the level of the substrate electric potential VBB shallower, that is, by pulling up the substrate electric potential VBB in the positive direction, it is possible to make use of a lot of the device in which the requirement of the refresh operation is severe due to a large amount of leakage from the n+ region 3 caused by manufacturing-process. Thus, yield is enhanced.

Second Embodiment

Figure 11:
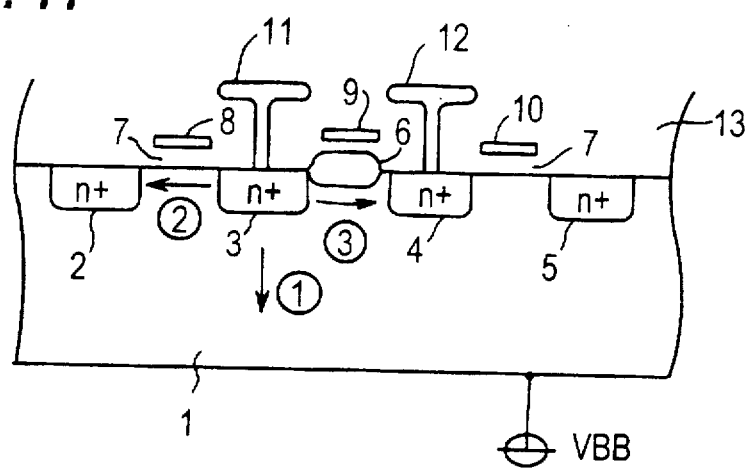
FIG. 11 is a diagram showing a cross section of a configuration of a MOS transistor composing a memory cell of a DRAM.

In the case of the first embodiment described above, the substrate voltage is controlled by considering the leakage occurring in memory cells as a whole. In the second embodiment to be described below, on the other hand, control of the substrate voltage in accordance with a leakage mode of the memory cells is explained. The leakage occurring in a memory cell is classified by leak destination into leak modes ①, ② and ③ as shown in FIG. 11. The substrate voltage VBB of the semiconductor substrate can be controlled depending upon the leak modes.

First, consideration is given to the leak mode ① shown in FIG. 11 in which electric charge flows from the n+ drain region 3 to the p-type substrate 1.

Figure 4:
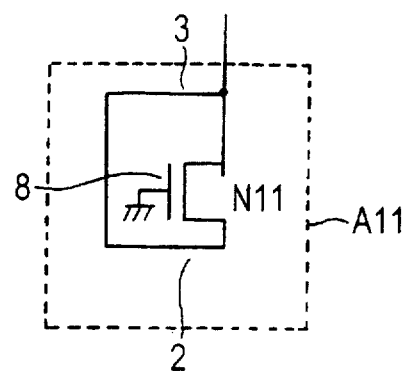
FIG. 4 is a diagram showing the circuit configuration of a dummy memory cell used for detecting leakage flowing from the n+ drain region to the p-type substrate.

FIG. 4 is a diagram showing the circuit configuration of a dummy memory cell A11 used for detecting leakage occurring in the leak mode ① shown in FIG. 11 in which electric charge flows from the n+ drain region 3 to the p-type substrate 1. As shown in 4, the source 2 and the drain 3 of the MOS transistor N11 are short-circuited, and the gate electrode 8 thereof is connected to the ground. A memory-cell leak monitor 101 can then be obtained by replacing the dummy memory cell A10 in the circuit shown in FIG. 1 with the dummy memory cell A11 shown in FIG. 4.

Figure 5:
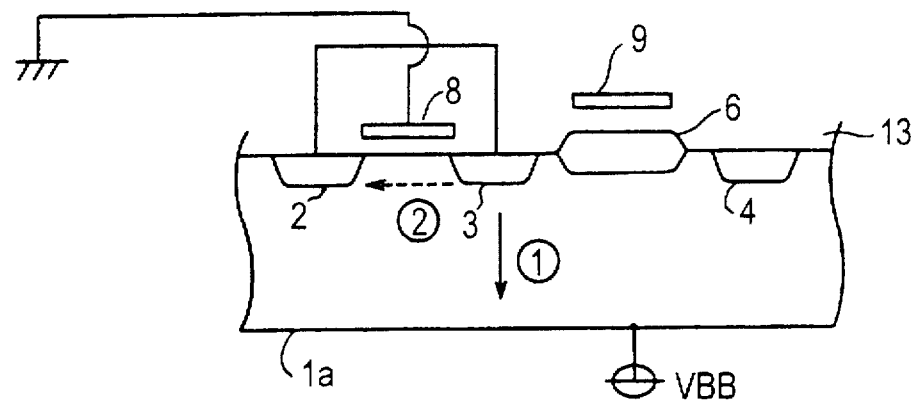
FIG. 5 is a diagram showing the cross section and the connection of the MOS transistor of the dummy memory cell shown in FIG. 4.

FIG. 5 is a diagram showing the cross section and the connection of the MOS transistor N11 of the dummy memory cell A11 shown in FIG. 4. In FIG. 5, the n+ source region 2 and the n+ drain region 3 are short-circuited, eliminating the leakage therebetween. As a result, leakage occurring in mode ① becomes predominant. The leakage of this kind is influential to a pause-refresh period in which write/read operation is not performed after accumulation of electric charge in the n+ drain region 3.

When the leakage of mode ① does or does not exist in the dummy memory cell A11 shown in FIG. 4, the operation of the memory-cell leak monitor 101 shown in FIG. 1 is the same as that of the first embodiment described earlier. Therefore, the explanation of the operation will not be repeated.

In this way, by using the dummy memory cell A11 like the one shown in FIG. 4 for leak monitoring, the level of the substrate voltage VBB can be controlled by detecting only the leakage of mode ①. As a result, it is possible to make use of a manufacturing lot in which the requirement for the refresh operation is severe due to a large amount of leakage from the n+ region 3 to the substrate 1. Thus, manufacturing yield is improved.

Third Embodiment

Next, consideration is given to the leakage occurring in a memory cell in the mode ② shown in FIG. 11 in which electric charge flows from the n+ region 3 to the n+ region 2 facing the n+ region 3 through a substrate portion beneath the gate electrode 8.

Figure 6:
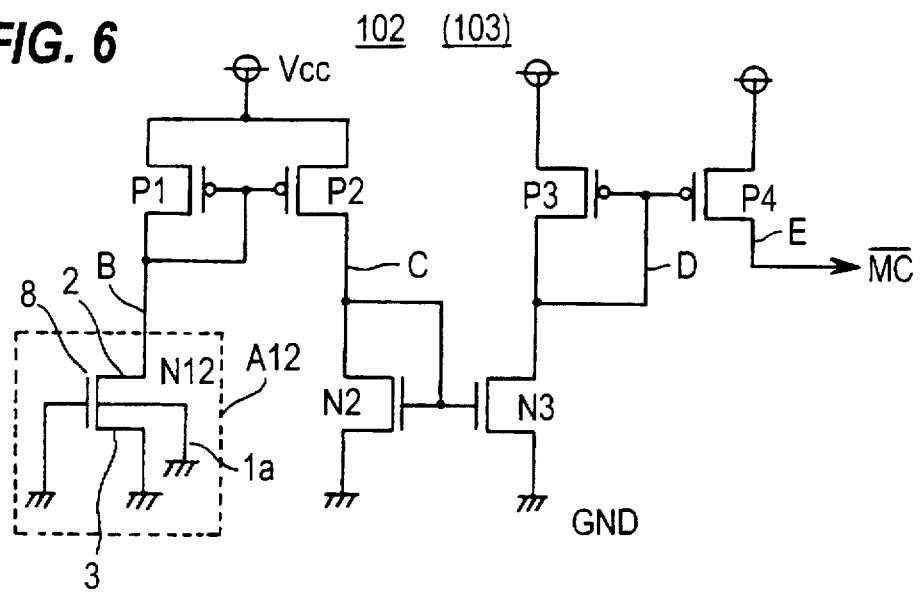
FIG. 6 is a diagram showing a memory-cell leak monitor for detecting leakage flowing from the n+ drain region to the n+ source region.

FIG. 6 is a diagram showing a memory-cell leak monitor 102 for the leakage occurring in mode ②. As shown in FIG. 6, a dummy memory cell A12 for memory-cell leak monitoring includes a MOS transistor N12. The dummy memory cell A12 is designed into the same structure of a memory cell. As shown in FIG. 6, however, the drain 3, the gate electrode 8 and the substrate 1a for the dummy memory cell A12 are connected to ground.

The memory-cell leak monitor 102 shown in FIG. 6 includes n-channel MOS transistors N2 and N3 and p-channel MOS transistors P1 to P4. With a power-supply voltage VCC applied, an output signal MC (with a bar appended thereto) is generated by the memory-cell leak monitor 102. The level of the output signal MC fluctuates to indicate the amount of leakage detected in the dummy memory cell A12. Having the same configuration as the circuit shown in FIG. 2 except that the portion after the node E of the p-channel MOS transistor P4 is eliminated, detailed explanation of this circuit is omitted. The logic of the output signal MC generated by the memory-cell leak monitor 102 shown in FIG. 6 is the inversion of the logic of the output signal MC generated by the memory-cell leak monitor 100 shown in FIG. 1.

Figure 7:
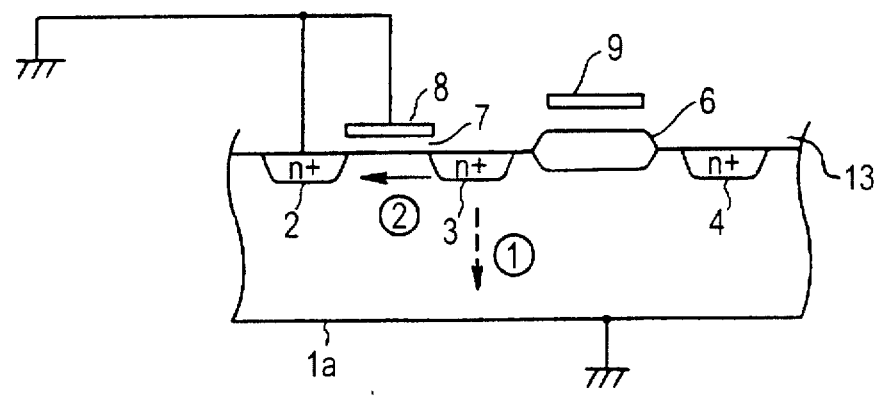
FIG. 7 is a diagram showing the cross section and the connection of the MOS transistor of the dummy memory cell shown in FIG. 6.

FIG. 7 is a diagram showing the cross section and the connection of the MOS transistor N12 of the dummy memory cell A12 shown in FIG. 6. As shown in FIG. 7, the substrate 1a for the dummy memory cell A12 is connected to ground, so that the voltage difference between the n+ drain region 3 and the substrate 1a is reduced. Therefore, the amount of leakage to the substrate 1a decreases, making the leakage occurring in mode ② predominant. By using the dummy memory cell A12 shown in FIG. 6 for leak monitoring, leak detection can be carried out focusing on the leakage occurring in mode ②. Such leakage has an effect on a refresh period in which write and read operations carried out in a memory cell is affected by a close signal line. Such a period is known as a so-called disturb refresh period.

Thus, the output signal $\overline{MC}$ generated by the memory-cell leak monitor 102 shown in FIG. 6 is used as a power supply of the ring oscillator 21 employed in the substrate-voltage generating circuit 200 shown in FIG. 3. In such a configuration, when the current caused by leakage occurring in mode ② increases, the level of the output signal $\overline{MC}$ rises, shortening the period of the ring oscillator 21. As a result, the substrate voltage VBB applied to the semiconductor substrate 1 becomes deeper. That is to say, the negative electric potential of the substrate voltage VBB is further pulled down to the negative side to a certain degree. As the substrate voltage VBB is pulled down in the negative direction, the threshold voltage of the MOS transistor of the memory cell is increased, making leakage from the source to the drain difficult to occur.

With this method, it possible to control the level of the substrate voltage VBB focusing on the leakage occurring in mode ②. As a result, it is possible to make use of a manufactured lot in which the effectiveness of the refresh operation is to be lost due to a great amount of leakage of mode ② which flows from the n+ region 3 to the n+ region 2 facing the n+ region 3 through the substrate portion beneath the gate electrode 8, which is caused by variances in manufacturing-process parameters. Thus, yield is improved.

Fourth Embodiment

Next, consideration is given to leakage occurring in a memory cell in mode ③ shown in FIG. 11, in which electric charge flows from the n+ region 3 to the adjacent n+ region 4 through a substrate portion beneath the LOCOS element isolation oxide film 6.

Figure 8:
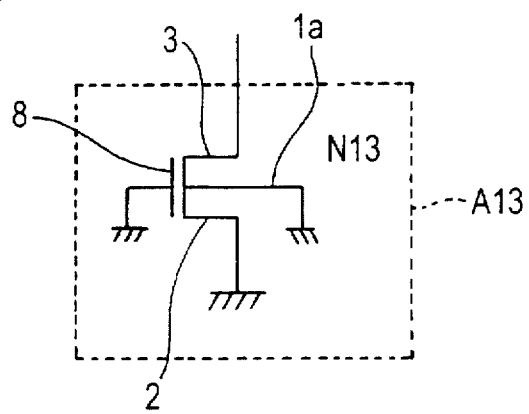
FIG. 8 is a diagram showing the circuit configuration of a dummy memory cell used for detecting leakage flowing from the n+ region to the adjacent n+ region across a portion beneath an element isolation film.

FIG. 8 is a diagram showing the circuit configuration of a dummy memory cell A13 used in this case. As shown in FIG. 8, the source 2 and the gate electrode 8 are connected to ground. In addition, the substrate 1a for a dummy memory cell A13 is also connected to ground as well. A thick gate oxide film is formed as will be described later. A memory-cell leak monitor 103 can then be obtained by replacing the dummy memory cell A12 in the circuit shown in FIG. 6 with the dummy memory cell A13 shown in FIG. 8.

Figure 9:
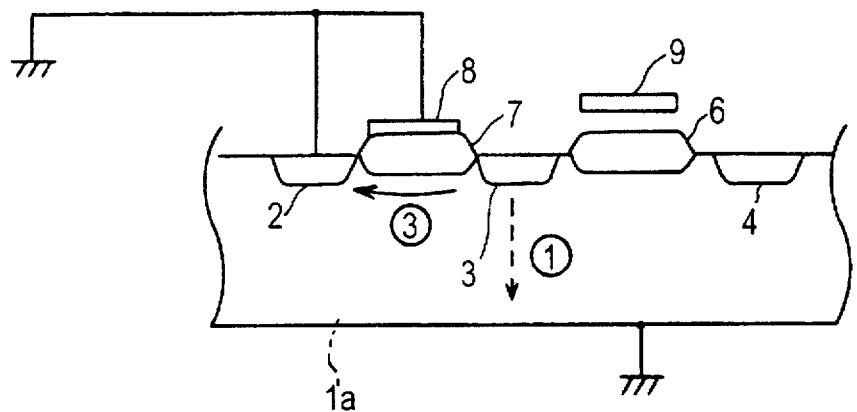
FIG. 9 is a diagram showing the cross section and the connection of the MOS transistor of the dummy memory cell shown in FIG. 8.

FIG. 9 is a diagram showing the cross section and the connection of the MOS transistor N13 of the dummy memory cell A13 shown in FIG. 8. As described above, the n+ source region 2, the gate electrode 8 and the substrate 1a for the dummy memory cell A13 are connected to ground. In addition, the thick gate oxide film 7 is formed into the same state as the element isolation oxide film 6. In this configuration, electric charge flows from the n+ region 3 to the adjacent n+ region 4 through a substrate portion beneath the LOCOS element isolation oxide film 6, simulating the leakage occurring in mode ③ shown in FIG. 11. As shown in FIG. 9, the substrate 1a is connected to ground, so that the difference in electric potential between the n+ region 3 and the substrate 1a is reduced. Therefore, the amount of leakage to the substrate 1a is reduced, making the leakage occurring in mode ③ predominant. By using the dummy memory cell A13 shown in FIG. 8 and 9 for leak monitoring, leak detection can be carried out by focusing on the leakage occurring in mode ③. The leakage of this kind has an effect on a refresh period when write and read operations are carried out in a memory cell being affected by a close signal line. As described earlier, such a period is known as the so-called disturb refresh period.

Thus, the output signal $\overline{MC}$ generated by the memory-cell leak monitor 103 shown in FIG. 6 is used as a power supply of the ring oscillator 21 employed in the substrate-voltage generating circuit 200 shown in FIG. 2. In such a configuration, when the current caused by leakage occurring in mode ③ increases, the level of the output signal $\overline{MC}$ rises, shortening the period of the ring oscillator 21. As a result, the substrate voltage VBB applied to the semiconductor substrate 1 becomes deeper. That is to say, the negative electric potential of the substrate voltage VBB is further pulled down to the negative side to a certain degree. As the substrate voltage VBB is pulled down in the negative direction, leakage in mode ③ shown in FIG. 11 is suppressed in a memory cell, which flows from the n+ region 3 to the adjacent n+ region 4 through a substrate portion beneath the LOCOS element isolation oxide film 6.

With this method, it possible to control the level of the substrate voltage VBB focusing on the leakage occurring in mode ③. As a result, it is also possible to make use of a manufactured lot in which the effectiveness of the refresh operation is to be lost due to a great amount of leakage from the n+ region 3 to the adjacent n+ region 4 through a substrate portion beneath the LOCOS element isolation oxide film 6 in mode ③ of FIG. 11, which is caused by variances in manufacturing-process parameters. Thus, yield is improved.

Fifth Embodiment

Figure 10:
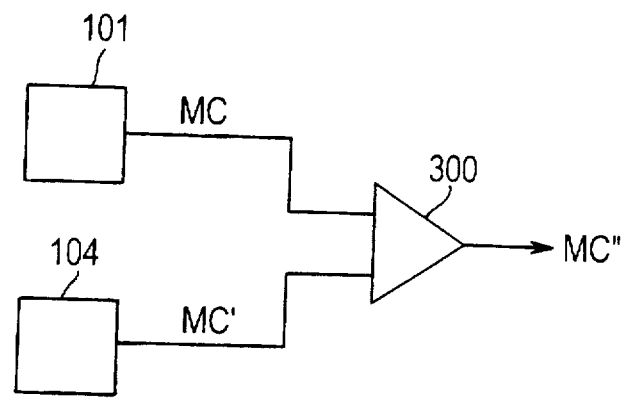
FIG. 10 is a diagram showing a memory-cell leak monitor in a semiconductor memory device according to a still further embodiment of the present invention.

FIG. 10 is a diagram showing a memory-cell leak monitor in a semiconductor memory device according to a still further embodiment of the present invention.

As is understood from the embodiments described so far, in the case of leakage occurring in a memory cell in mode ① shown in FIG. 11 in which electric charge flows from the n+ region 3 to the semiconductor substrate 1, the substrate voltage VBB is controlled so that the level thereof is raised in a direction of becoming shallower. On the contrary, in the case of leakage occurring in a memory cell in mode ② shown in FIG. 11 in which electric charge flows from the n+ region 3 to the n+ region 2 facing the n+ region 3 through a substrate portion beneath the gate electrode 8, and in the case of leakage occurring in a memory cell in mode ③ shown in FIG. 11 in which electric charge flows from the n+ region 3 to the adjacent n+ region 4 through a substrate portion beneath the LOCOS element isolation oxide film 6, the substrate voltage VBB is controlled so that the level thereof is lowered in a direction of becoming deeper. In this way, the direction in which the substrate voltage VBB is controlled is reversed in accordance with the mode of the leakage. It is thus effective to implement the control by detecting the predominant mode of leakage current. In the semiconductor device provided by the present embodiment, such a control is implemented.

In a circuit shown in FIG. 10, a memory-cell leak monitor 101 includes the dummy memory cell A11 shown in FIG. 4 in place of the dummy memory cell A10 in the memory-cell leak monitor shown in FIG. 1. The memory-cell leak monitor 101 generates an output signal MC. On the other hand, a memory-cell leak monitor 104 includes the dummy memory cell A12 or A13 shown in FIG. 6 or 8 in place of the dummy memory cell A10 in the memory-cell leak monitor shown in FIG. 1. The memory-cell leak monitor 104 generates an output signal MC'. A comparison means or a comparator 300 compares the output signal MC generated by the memory-cell leak monitor 101 with the output signal MC' generated by the memory-cell leak monitor 104. A signal MC" output by the comparator 300 is then supplied to the substrate-voltage generating circuit 200 shown in FIG. 3 as a power-supply voltage in place of the power-supply voltage MC.

As shown in FIG. 10, the comparator 300 is used for comparing the output signal MC with the output signal MC'. If the output signal MC is found to be larger, that is, if the amount of leakage occurring in mode ① is found to be larger, the level of the output signal MC" generated by comparator 300 is lowered, making the substrate voltage VBB applied to the semiconductor substrate 1 by the substrate-voltage generating circuit 200 shallower. If the output signal MC' is found to be larger, that is, if the amount of leakage occurring in mode ② or ③ is found to be larger, on the other hand, the level of the output signal MC" generated by comparator 300 is raised, making the substrate voltage VBB applied to the semiconductor substrate 1 by the substrate-voltage generating circuit 200 deeper. In this way, by comparing the amount of leakage occurring in mode ① with the amount of leakage occurring in mode ② or ③, it is possible to set the substrate voltage VBB at such a level that the amount of the predominant leakage is reduced. As a result, it is possible to most effectively control the level of the substrate voltage VBB by detecting the mode in which the predominant leakage occurs. In other words, it is possible to control the substrate voltage VBB by giving priority to the leak mode in which the amount of leakage is largest by means of a combination of two memory-cell leak monitors and a comparator. As a result, when several different modes of leak occur due to variations in manufacturing-process parameters, the predominant leakage caused by one of the modes can be suppressed most effectively, making it possible to make use of a manufactured lot in which the effectiveness of the refresh operation would otherwise be lost. Thus, yield is improved.

In the embodiments described above, an n-channel MOS transistor is used as a memory cell. It should be noted, however, that the scope of the present invention is not limited to such embodiments. The scope of the present invention includes properly modified versions which are obtained as a result of modification of the memory-cell transistor.

As described above in detail, according to the present invention, a dummy memory cell is formed on a semiconductor substrate in the same way as a memory cell is formed, and the substrate voltage applied to the semiconductor substrate is controlled by detecting the amount of leakage occurring in the dummy memory cell in order to reduce the amount of leakage occurring in the memory cell. To be more specific, the level of the substrate voltage VBB is controlled in accordance with the performance of the refresh operation carried out on the memory cell, allowing the interval between two consecutive refresh operations to be set so as to meet a prescribed requirement. As a result, it is possible to make use of a manufactured lot in which the effectiveness of the refresh operation would otherwise be lost due to variations in manufacturing-process parameters. Thus, yield is improved.

In addition, according to the present invention, an output signal generated by a leak detecting means is used for controlling the substrate voltage VBB to a shallower level, that is, for controlling the level of the substrate voltage VBB in accordance with the performance of the refresh operation carried out on the memory cell. As a result, the interval between two consecutive refresh operations can be set so as to meet a prescribed requirement, making it possible to make use of a manufactured lot in which the effectiveness of the refresh operation would otherwise be lost. Thus, yield is improved.

Further, according to the present invention, a MOS transistor is formed for a dummy memory cell on a substrate portion for the dummy memory cell, and mainly leakage between the source of the MOS transistor and the substrate portion for the dummy memory cell is detected. As a result, it is possible to make use of a manufactured lot in which the effectiveness of the refresh operation would otherwise be lost due to a great amount of leakage from the n+ region to the semiconductor substrate. Thus, yield is improved.

In addition, according to the present invention, the output signal generated by the leak detecting means is used for controlling the substrate voltage so that the level thereof becomes deeper. As a result, the interval between two consecutive refresh operations can be set so as to meet a prescribed requirement, making it possible to make use of a manufactured lot in which the effectiveness of the refresh operation would otherwise be lost. Thus, yield is improved.

Further, according to the present invention, a MOS transistor is formed for a dummy memory cell on a substrate portion for the dummy memory cell, and mainly leakage between the source and the drain of the MOS transistor is detected. As a result, it is possible to make use of a manufactured lot in which the effectiveness of the refresh operation would otherwise be lost due to a great amount of leakage from the first n+ region to the second n+ region facing the first n+ region through a substrate portion beneath the gate electrode. Thus, yield is improved.

In addition, according to the present invention, a gate insulating film of the dummy memory cell is formed in the same manner as the element isolation insulating film is formed, and mainly leakage flowing from the n+ region of the MOS transistor to the adjacent n+ region through a substrate portion beneath the LOCOS element isolation oxide film 6 is detected. As a result, it is possible to make use of a manufactured lot in which the effectiveness of the refresh operation would otherwise be lost due to a great amount of leakage from flowing from the n+ region of the MOS transistor to the adjacent n+ region through a substrate portion beneath the LOCOS element isolation oxide film caused by variations in manufacturing-process parameters. Thus, yield is improved.

Further, according to the present invention, at least two dummy memory cells are provided on the semiconductor substrate in the same way as the memory cell is formed on the semiconductor substrate. Leak of electric charge occurring in one of the dummy memory cell in a leakage mode and leak of electric charge occurring in the other dummy memory cell in another leakage mode are detected, and leak amounts are compared with each other. The substrate voltage of the semiconductor substrate is then controlled so as to suppress the leak occurring in the worst leakage mode. As a result, when several leaks occur in different leakage modes due to variations in manufacturing-process parameters, the predominant leak caused by one of the leakage modes can be suppressed most effectively, making it possible to make use of a manufactured lot in which the effectiveness of the refresh operation would otherwise be lost. Thus, yield is improved.

In addition, according to the present invention, at least two dummy memory cells are each formed by a MOS transistor formed on a substrate portion for the associated dummy memory cell, and at least two leak detecting means are provided. One of the two leak detecting means is used for detecting mainly a leak between the source of the MOS transistor and the substrate portion for the associated dummy memory cell, and the other leak detecting means is used for detecting mainly a leak between the source and the drain of the other MOS transistor. The substrate voltage of the semiconductor substrate is then controlled so as to suppress the leak occurring in the worst leakage mode. As a result, when several leaks occur in different leakage modes due to variations in manufacturing-process parameters, the predominant leak caused by one of the leakage modes can be suppressed most effectively. Thereby, it is possible to make use of a manufactured lot in which the effectiveness of the refresh operation would otherwise be lost. Thus, yield is improved.

Obviously, numerous additional modifications and variations of the present invention are possible in light of the above teachings. It is therefore to be understood that within the scope of the appended claims, the present invention may be practiced otherwise than as specifically described herein.

I claim:

1. A semiconductor memory device comprising:

a memory cell formed on a semiconductor substrate;

a dummy memory cell formed on said semiconductor substrate in the same way as said memory cell is formed;

a leak detecting means for detecting leakage from said dummy memory cell and generating an output signal representing the amount of said leakage; and a substrate-voltage generating means for controlling a substrate voltage applied to said semiconductor substrate so as to reduce the amount of said leakage from said memory cell in accordance with said output signal supplied to said substrate-voltage generating means by said leak detecting means.

2. The semiconductor memory device according to claim 1, wherein said substrate voltage is controlled to a shallow level by said output signal generated by said leak detecting means.

3. The semiconductor memory device according to claim 2, wherein said dummy memory cell comprises a MOS transistor formed on a substrate portion for said dummy memory cell, and leakage between a drain of said MOS transistor and said substrate portion is detected by said leak detecting means.

4. The semiconductor memory device according to claim 1, wherein said substrate voltage is controlled to a deeper level by said output signal generated by said leak detecting means.

5. The semiconductor memory device according to claim 4, wherein said dummy memory cell comprises a MOS transistor formed on a substrate portion for said dummy memory cell, and leakage between a drain and a source of said MOS transistor is detected by said leak detecting means.

6. The semiconductor memory device according to claim 5, wherein a gate insulating film of said dummy memory cell is formed as an element separating insulation film of said memory cell is formed.

7. A semiconductor memory device comprising:

memory cells formed on a semiconductor substrate;

at least two dummy memory cells formed on said semiconductor substrate in the same way as said memory cells are formed;

at least two leak detecting means associated with said dummy memory cells each for detecting leakage from said respective dummy memory cell and generating an output signal representing the amount of said leakage;

a comparison means for comparing said output signals generated by said leak detecting means with each other and generating a comparison output signal; and a substrate-voltage generating means for controlling a substrate voltage applied to said semiconductor substrate so as to reduce the amount of said leakage from said memory cells in accordance with said comparison output signal supplied to said substrate-voltage generating means by said comparison means.

8. The semiconductor memory device according to claim 7, wherein said dummy memory cells each comprise a MOS transistor formed on a substrate portion for said dummy memory cell, and leakage between a drain of said MOS transistor and said substrate portion is detected by one of said leak detecting means while leakage between said drain and a source of said MOS transistor is detected by the other leak detecting means.

* * * * *